(12) United States Patent
Xi et al.

(10) Patent No.: US 9,601,053 B2
(45) Date of Patent: Mar. 21, 2017

(54) PIXEL UNIT OF ORGANIC ELECTROLUMINESCENT DISPLAY

(71) Applicant: Au Optronics Corporation, Hsinchu (TW)

(72) Inventors: Peng-Bo Xi, Taipei (TW); Ya-Ling Hsu, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 215 days.

(21) Appl. No.: 14/297,655

(22) Filed: Jun. 6, 2014

(65) Prior Publication Data

US 2015/0279271 A1    Oct. 1, 2015

(30) Foreign Application Priority Data

Mar. 31, 2014  (TW) .............................. 103111948 A

(51) Int. Cl.
    *G09G 3/30*    (2006.01)
    *G09G 3/32*    (2016.01)
    *H01L 27/32*   (2006.01)

(52) U.S. Cl.
    CPC ......... *G09G 3/3233* (2013.01); *H01L 27/326* (2013.01); *H01L 27/3276* (2013.01); *G09G 2300/0426* (2013.01); *G09G 2300/0842* (2013.01)

(58) Field of Classification Search
    USPC .......................................................... 345/76
    See application file for complete search history.

(56) References Cited

U.S. PATENT DOCUMENTS

| 7,545,347 | B2 | 6/2009 | Kanda |
| 8,164,267 | B2 | 4/2012 | Matsueda et al. |
| 8,896,587 | B2 | 11/2014 | Nakamura |
| 8,970,456 | B2 | 3/2015 | Lhee et al. |
| 2004/0108978 | A1 | 6/2004 | Matsueda et al. |
| 2007/0063192 | A1* | 3/2007 | Peng .................... G09G 3/3225 257/40 |
| 2008/0290807 | A1 | 11/2008 | Matsueda et al. |
| 2011/0109611 | A1 | 5/2011 | Nakamura |
| 2012/0056904 | A1 | 3/2012 | Lhee et al. |
| 2015/0170567 | A1 | 6/2015 | Lhee et al. |

FOREIGN PATENT DOCUMENTS

| CN | 1410962 | 4/2003 |
| CN | 1937869 | 3/2007 |

(Continued)

*Primary Examiner* — Gustavo Polo
(74) *Attorney, Agent, or Firm* — Jianq Chyun IP Office

(57) ABSTRACT

A pixel unit of an organic electroluminescent display having a light emitting area and a transparent area is provided. The pixel unit includes a scan line, a data line, a control element electrically connected to the scan line and the data line, a power line electrically connected to the control element and an organic light-emitting diode disposed inside the light emitting area and electrically connected to the power line and the control element. The power line includes a main portion and a plurality of branch portions connected to the main portion. The branch portions are disposed inside the transparent area and electrically independent from the data line. A width of each of the branch portions is identical to a minimum line width of the data line.

14 Claims, 12 Drawing Sheets

(56) References Cited

FOREIGN PATENT DOCUMENTS

| | | |
|---|---|---|
| CN | 101030594 | 9/2007 |
| CN | 101436608 | 5/2009 |
| CN | 101777576 | 7/2010 |
| CN | 101983397 | 3/2011 |
| TW | 201003591 | 1/2010 |
| TW | 201212221 | 3/2012 |

* cited by examiner

PIXEL UNIT OF ORGANIC ELECTROLUMINESCENT DISPLAY

CROSS-REFERENCE TO RELATED APPLICATION

This application claims the priority benefit of Taiwan application serial no. 103111948, filed on Mar. 31, 2014. The entirety of the above-mentioned patent application is hereby incorporated by reference herein and made a part of this specification.

BACKGROUND OF THE INVENTION

Field of the Invention

The invention relates to a pixel unit, and more particularly, relates to a pixel unit of an organic electroluminescent display.

Description of Related Art

With advancement in display technologies, transparent displays have been gradually developed. A transparent display has a sufficient transparency rate, which enables a person to clearly watch a background image behind the transparent display. Since the transparent display may be applied to windows of buildings or cars, or may be used in showcase events, the transparent display has attracted great attention of the market. Generally, the transparent display may be classified into a self-illuminating type and a non self-illuminating type. Because the self-illuminating type transparent display does not need to dispose a backlight module that blocks part of a background image light beam, it is more suitable for applications in the field of the transparent display as compared to the non self-illuminating type transparent display.

The self-illuminating transparent display includes an organic electroluminescent display which utilizes an organic light emitting layer as a display medium. In order to cope with driving characteristics of the organic light emitting layer, the organic electroluminescent display is disposed with a power line coupled to the organic light emitting layer. In conventional technology, the power line and a data line are usually disposed inside a specific mesh region, such that light cannot easily pass through the mesh region. The background image light beam is non-uniformly blocked by the mesh region while passing through the organic electroluminescent display, which then leads to a blur issue for the background image. In addition, the conventional power line is mostly a mesh structure composed of vertical lines and horizontal lines, and the mesh structure can easily be interfered with a background object having a periodic structure to generate the Moire fringes that is disadvantageous for a transparent display effect.

SUMMARY OF THE INVENTION

The invention is directed to a pixel unit of an organic electroluminescent display, and the organic electroluminescent display utilizing said pixel is capable of providing a more preferable transparent display effect.

The invention provides a pixel unit of an organic electroluminescent display having a light emitting area and a transparent area. The pixel unit includes a scan line, a data line, a control element electrically connected to the scan line and the data line, a power line electrically connected to the control element and an organic light-emitting diode disposed inside the light emitting area and electrically connected to the power line and the control element. The power line includes a main portion and a plurality of branch portions connected to the main portion. The branch portions are disposed inside the transparent area and electrically independent from the data line. A width of each of the branch portions is identical to a minimum line width of the data line.

The invention provides a pixel unit of an organic electroluminescent display having a first light emitting area, a second light emitting area and a transparent area. The pixel unit includes a scan line, a first data line and a second data line, a first control element electrically connected to the scan line and the first data line, a second control element electrically connected to the scan line and the second data line, a power line electrically connected to the first control element and the second the control element, a first organic light-emitting diode disposed inside the first light emitting area and electrically connected to the power line and the first control element, and a second organic light-emitting diode disposed inside the second light emitting area and electrically connected to the power line and the second control element. The power line includes a main portion and a plurality of branch portions connected to the main portion. The branch portions are connected to the main portion, disposed inside the transparent area, and distributed between the first data line and the second data line. The branch portions are electrically independent from the first data line and the second data line, and a width of each of the branch portions is identical to minimum line widths of the first data line and the second data line.

Based on above, in the pixel unit of the organic electroluminescent display according to an embodiment of the invention, the branch portions of the power line are distributed inside the transparent area for each of pixel units. Therefore, in case the pixel units are arranged in a plurality of rows to compose an organic electroluminescent display, the branch portions of the power line and the data line are distributively disposed in a region between adjacent two of the rows of the control elements. Accordingly, differences between the light transmittances in positions of the region between the adjacent two control elements cannot be overly big, so as to improve the blur issue for the background image due to the data lines and the power being overly concentrated at specific positions.

To make the above features and advantages of the disclosure more comprehensible, several embodiments accompanied with drawings are described in detail as follows.

DESCRIPTION OF THE EMBODIMENTS

Figure 1A:
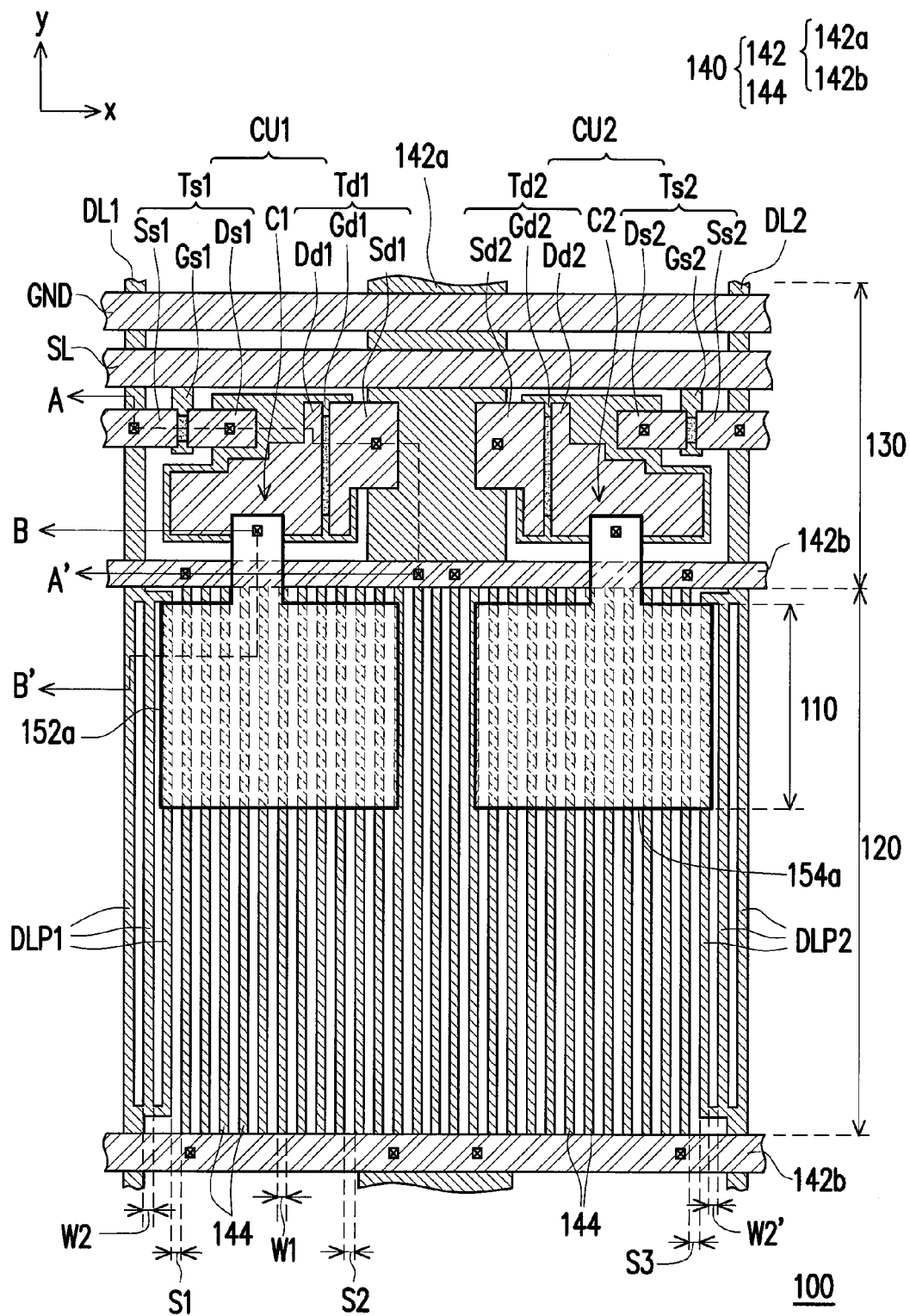
FIG. 1A is a top view of a pixel unit of an organic electroluminescent display according to an embodiment of the invention.
Figure 1B:
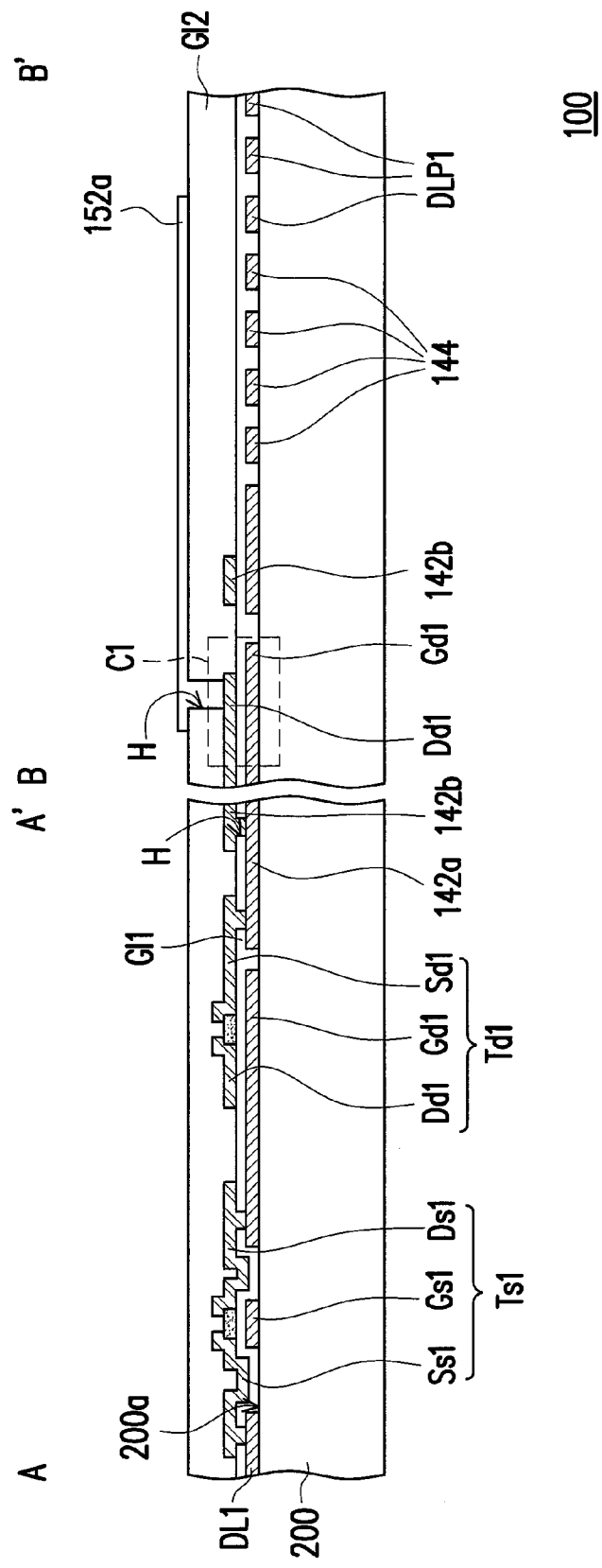
FIG. 1B is a cross-sectional view of the pixel unit of the organic electroluminescent display of FIG. 1A along section-lines A-A' and B-B'.

FIG. 1A is a top view of a pixel unit of an organic electroluminescent display according to an embodiment of the invention. FIG. 1B is a cross-sectional view of the pixel unit of the organic electroluminescent display of FIG. 1A along section-lines A-A' and B-B'. Referring to FIG. 1A and FIG. 1B, a pixel unit 100 has a light emitting area 110 and a transparent area 120. The pixel unit 100 further includes a control element area 130 outside the transparent area 120. The pixel unit 100 at least includes a scan line SL, a first data line DL1, a first control element CU1, a power line 140 and an electrode 152a of a first organic light-emitting diode. In the present embodiment, the pixel unit 100 may further include a second data line DL2, a second control element CU2 and an electrode 154a of a second organic light-emitting diode. It should be noted that, amounts of the data lines, the control elements and electrodes of the organic light-emitting diodes included in the pixel unit of the invention are not limited only to what illustrated in FIG. 1A, and the amounts of the data lines, the control elements and electrodes of the organic light-emitting diodes included in the pixel unit may all be properly designed according to actual requirements. For instance, in comparison with the pixel unit 100, it is possible that pixel units in other embodiments do not include the second data line DL2, the second control element CU2 and the electrode 154a of the second organic light-emitting diode but include only the rest of components of the pixel unit 100, and those pixel units and organic electroluminescent displays utilizing those pixel units also fall within the scope of the present invention for which protection is sought.

The power line 140 includes a main portion 142 and a plurality of branch portions 144 connected to the main portion 142. In the present embodiment, the scan line SL, the first data line DL1 and the second data line DL2 encircle the light emitting area 110, the transparent area 120 and the control element area 130. The transparent area 120 and the control element area 130 constitute a pixel unit area. The electrode 152a of the first organic light-emitting diode and the electrode 154a of the second organic light-emitting diode are disposed inside the light emitting area 110. The first control element CU1 and the second control element CU2 are disposed inside the control element area 130. The branch portions 144 of the power line 140 are distributively disposed inside the transparent area 120 outside the control element area 130. An orthographic projection of at least a part of the branch portions 144 on a substrate 200 overlaps with an orthographic projection of the electrodes 152a and 154a on the substrate 200 on a direction y parallel to the first data line DL1. In the present embodiment, the light emitting area 110 may be selectively disposed inside the transparent area 120. However, the invention is not limited thereto. In other embodiments, the light emitting area may also be disposed outside the transparent area (e.g., disposed inside the control element area 130), and details regarding the same will be specifically illustrated and described in subsequent embodiments.

Figure 2:
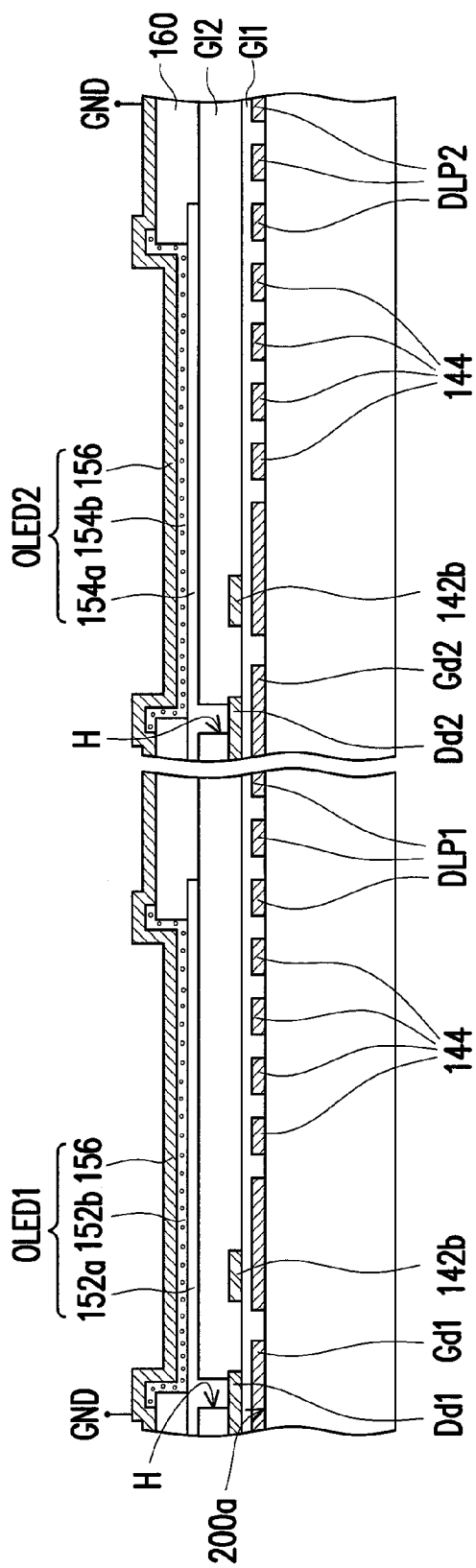
FIG. 2 illustrates a circumstance where the pixel unit of FIG. 1A is applied in the organic electroluminescent display.

FIG. 2 illustrates a circumstance where the pixel unit of FIG. 1A is applied in the organic electroluminescent display. When the pixel unit 100 is applied in the organic electroluminescent display, the pixel unit 100 may include a light emitting pattern definition layer 160 exposing the electrode 152a and the electrode 154a. A first organic light emitting layer 152b may be disposed on a part of the electrode 152a exposed by the light emitting pattern definition layer 160. A second organic light emitting layer 154b may be disposed on a part of the electrode 154a exposed by the light emitting pattern definition layer 160. An electrode 156 covers the first organic light emitting layer 152b and the second organic light emitting layer 154b. The electrode 152a, the first organic light emitting layer 152b and the electrode 156 form a first organic light-emitting diode OLED1. The electrode 154a, the second organic light emitting layer 154b and the electrode 156 form a second organic light-emitting diode OLED2. The electrode 156 of FIG. 2 may be electrically connected to a ground line GND of FIG. 1A.

Figure 3:
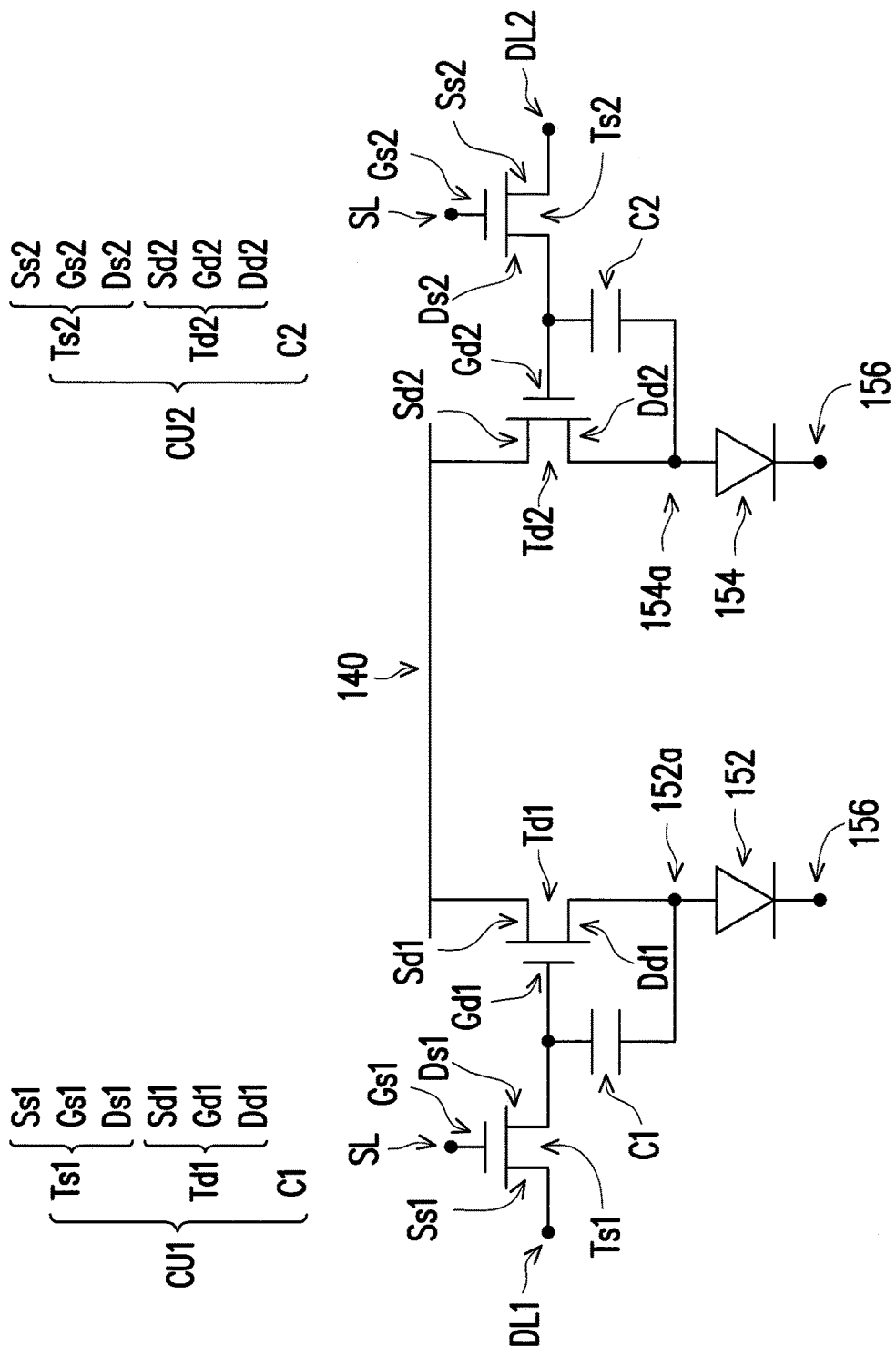
FIG. 3 illustrates an equivalent circuit diagram of the pixel unit of FIG. 1A applied in the organic electroluminescent display.

FIG. 3 illustrates an equivalent circuit diagram of the pixel unit of FIG. 1A applied in the organic electroluminescent display. Electrical relationships among components of the pixel unit 100 are described below by reference with FIG. 1A, FIG. 1B, FIG. 2 and FIG. 3. Referring to FIG. 1A, FIG. 1B, FIG. 2 and FIG. 3, the first control element CU1 is electrically connected to the scan line SL and the first data line DL1. The first control element CU1 includes at least two active devices Ts1, Td1 and at least one capacitor C1. The active device Ts1 includes a source Ss1, a gate Gs1 and a drain Ds1. The active device Td1 includes a source Sd1, a gate Gd1 and a drain Dd1. The source Ss1 of the active device Ts1 may be electrically contacted to the first data line DL1. The gate Gs1 of the active device Ts1 may be electrically contacted to the scan line SL. The drain Ds1 of the active device Ts1 may be electrically contacted to the gate Gd1 of the active device Td1. As shown in FIG. 1A and FIG. 1B, the gate Gd1 of the active device Td1 overlaps with the drain Dd1 of the active device Td1 to compose the capacitor C1, wherein a carrying surface 200a carries and faces the pixel unit 100. The power line 140 is electrically connected to the first control element CU1. To be specific, the power line 140 may be electrically contacted to the source Sd1 of the active device Td1. The electrode 152a of the first organic light-emitting diode 152 may be filled into a contact window H of an insulation layer GI2 to be electrically contacted to the drain Dd1 of the active device Td1. The electrode 156 of the first organic light-emitting diode 152 (illustrated in FIG. 2) may be electrically connected to a common reference potential (i.e., the ground line GND as shown in FIG. 1A).

Referring to FIG. 1A, FIG. 1B, FIG. 2 and FIG. 3, similarly, the second control element CU2 is electrically connected to the scan line SL and the second data line DL2 adjacent to the first data line DLL In the present embodiment, the second control element CU2 includes active devices Ts2, Td2 and at least one capacitor C2. The active device Ts2 includes a source Ss2, a gate Gs2 and a drain Ds2. The active device Td2 includes a source Sd2, a gate Gd2 and a drain Dd2. The source Ss2 of the active device Ts2 may be electrically contacted to the second data line DL2. The gate Gs2 of the active device Ts2 may be electrically contacted to the scan line SL. The drain Ds2 of the active device Ts2 may be electrically contacted to the gate Gd2 of the active device Td2. As shown in FIG. 1A, the gate Gd2 of the active device Td2 overlaps with the drain Dd2 of the active device Td2 to compose the capacitor C2. The power line 140 is electrically connected to the second control element CU2. To be specific, the power line 140 may be electrically contacted to the source Sd2 of the active device Td2. The electrode 154a of the second organic light-emitting diode 154 may be filled into the contact window H of the insulation layer GI2 to be electrically contacted to the drain Dd2 of the active device Td2. The electrode 156 of the second organic light-emitting diode 154 (illustrated in FIG. 2) may be electrically connected to a common reference potential (i.e., the ground line GND as shown in FIG. 1A).

In brief, in the present embodiment, the first control element CU1 and the second control element CU2 may respectively include two transistors and one capacitor (i.e., 2T1C). However, the invention is not intended to limit the architecture of the first and second control elements, it falls within the scope of the present invention for which protection is sought as long as the first and second control elements are a circuit architecture capable of being electrically connected to the scan line and data line thereby driving the organic light-emitting diode. For instance, in other embodiments, the first and second control elements may also have three transistors and one capacitor (i.e., 3T1C), four transistors and two capacitors (i.e., 4T2C), five transistors and one capacitor (i.e., 5T1C) or other suitable architectures.

Referring to FIG. 1A and FIG. 1B, the power line 140 includes the main portion 142 and the branch portions 144 connected to the main portion 142. The branch portions 144 of the power line 140 are electrically independent from the first data line DL1 and the second data line DL2. The branch portions 144 are spaced apart from the first data line DL1 and the second data line DL2. In the present embodiment, the main portion 142 may include a first main portion 142a parallel to the first data line DL1 and the second data line DL2, and at least one second main portion 142b connected to the first main portion 142a and parallel to the scan line SL. The first main portion 142a and the second main portion 142 are electrically connected so as to have the same potential. The main portion 142 and the branch portions 144 are electrically connected so as to have the same potential. Furthermore, in the present embodiment, the first main portion 142a belongs to a first conductive layer as the same to the gate Gd1. The branch portions 144 and the first main portion 142a are directly connected and belonging to the same layer. The second main portion 142b belongs to a second conductive layer as the same to the source Sd1. The second main portion 142b may be filled into the contact window H (marked in FIG. 1B) of an insulation layer GI (marked in FIG. 1B) to be electrically contacted to the first main portion 142a, wherein an insulation layer GI1 is disposed between the source Sd1 and the gate Gd1. It should be noted that, the invention is not intended to limit the layers to which the first main portion 142a, the second main portion 142b and the branch portions 144 belong, or limit the branch portions 144 to be directly connected to the first main portion 142a, the second main portion 142b or other conductive patterns and belonging to the same layer. The layers to which the first main portion 142a, the second main portion 142b and the branch portions 144 belong, and layer relationships among the three may both be properly designed according to actual requirements for layout of the pixel unit.

In the present embodiment, as shown in FIG. 1A, the branch portions 144 may be disposed in parallel to one another. Each of the branch portions 144 may be a straight line segment. However, the invention is not intended to limit relative position relationships among the branch portions and a shape of each of the branch portions. In other embodiments, the branch portions may also be disposed by using different relative positions and may be in other appropriate shapes, and details regarding the same will be specifically illustrated and described in subsequent embodiments. It should be noted that, a width W1 of each of the branch portions 144 is identical to a minimum line width W2 of the first data line DL1, wherein the width W1 and the minimum line width W2 refer to widths on a direction x parallel to the scan line SL. In the present embodiment, the first data line DL1 is not the straight line segment, but appeared in mesh inside the transparent area 120. To be specific, the first data line DL1 may include a vertical branch portion DLP1 parallel to the branch portions 144, The minimum line width W2 of the first data line DL1 refers to a width of the vertical branch portion DLP1 on the direction x. Similarly, the width W1 of each of the branch portions 144 is identical to a minimum line width W2' of the second data line DL2, wherein the width W1 and the minimum line width W2' refer to widths on the direction x parallel to the scan line SL. In the present embodiment, the second data line DL2 may include a vertical branch portion DLP2 parallel to the branch portions 114. The minimum line width W2' of the second data line DL2 refers to a width of the vertical branch portion DLP2 on the direction x.

In the present embodiment, a first space S1 is provided between the first data line DL1 and one of the branch portions 144 that is closest to the first data line DL1. A second space S2 is provided between adjacent two of the branch portions 144. The first space S1 and the second space S2 may be identical. Furthermore, a third space S3 is provided between the second data line DL2 and one of the branch portions 144 that is closest to the second data line DL2, and the first space S1, the second space S2 and the third space S3 may be identical. In other words, the vertical branch portion DLP1 of the first data line DL1, the vertical branch portion DLP2 of the second data line DL2 and the branch portions 144 of the power line 140 may be uniformly distributed inside the transparent area 120. However, the invention is not limited thereto. The branch portions of the first data line, the second data line and the power line may also be irregularly distributed inside the transparent area 120, and details regarding the same will be specifically illustrated and described in subsequent embodiments.

Figure 4:
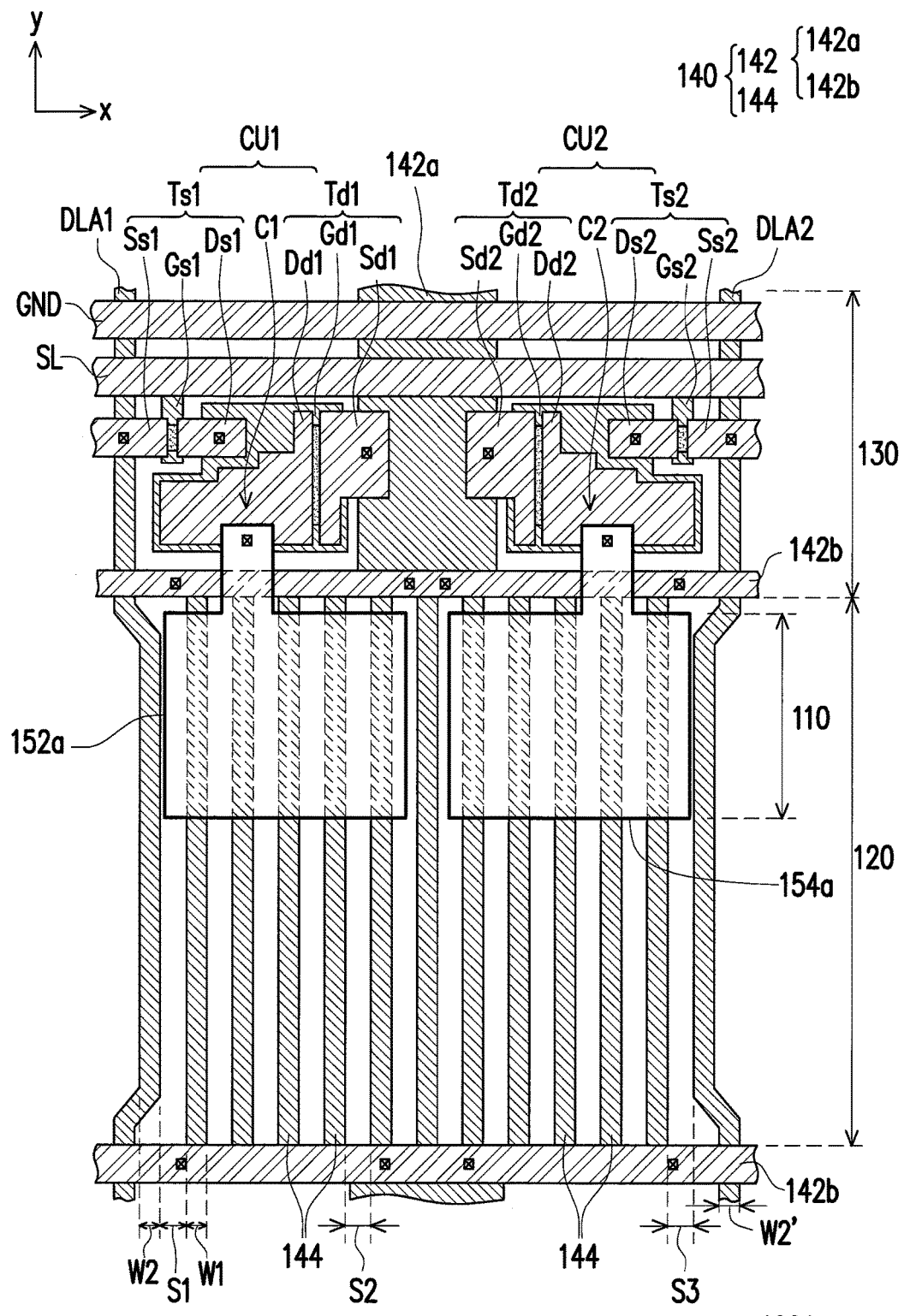
FIG. 4 is a top view of a pixel unit of an organic electroluminescent display according to another embodiment of the invention.

FIG. 4 is a top view of a pixel unit of an organic electroluminescent display according to another embodiment of the invention. Referring to FIG. 4, a pixel unit 100A of an organic electroluminescent display of FIG. 4 is similar to the pixel unit 100 of the organic electroluminescent display of FIG. 1A, thus identical or corresponding elements are indicated by the same or corresponding reference numbers. Differences between the two are: shapes of the first and second data lines DLA1, DLA2 of the pixel unit 100A are different from shapes of the first and second data lines DL1, DL2 of the pixel unit 100; the second space S2 of the pixel unit 100A is different from the second space S2 of the pixel unit 100; and the width W1 of each of the branch portions 144 of the pixel unit 100A is different from the width W1 of each of the branch portions 144 of the pixel unit 100. An amount of the branch portions 144 of the pixel unit 100A is different from an amount of the branch portions 144 of the pixel unit 100. The differences between the two are specifically described as follows, whereas the identical parts of the two may refer to related descriptions of FIG. 1A by reference with the reference numbers in FIG. 4, which will not be repeated hereinafter.

The first and second data lines DLA1, DLA2 of the pixel unit 100A may be straight line segments having identical widths instead of being appeared in mesh inside a region encircle by the adjacent two of the second main portions 142b as similar to that of the first and second data lines DL1, DL2 in FIG. 1A. Moreover, in comparison with the pixel unit 100, the second space S2, the width W1 of each of the branch portions 144 and the amount of the branch portions 144 in the pixel unit 100A may be further optimized to improve a light transmittance of the transparent area 120. For instance, the width W1 of each of the branch portions 144, the second space S2 and the amount of the branch portions 144 in the pixel unit 100 of FIG. 1A may be 5 μm/10 μm/27, respectively; whereas the width W1 of each of the branch portions 144, the second space S2 and the amount of the branch portions 144 in the pixel unit 100A of FIG. 4 may be further optimized to be 15 μm/22 μm/11. Comparison of FIG. 1A and FIG. 4 shows that, the light transmittance of the transparent area 120 in pixel unit 100A of FIG. 4 is obviously higher than the light transmittance of the transparent area 120 in the pixel unit 100 of FIG. 1A. It is worth mentioning that, while reducing the amount of the branch portions 144 to improve the light transmittance of the transparent area 120, the pixel unit 100A may also increase the width W1 of each of the branch portions 144, so that a resistance of the power line 140 of the pixel unit 100A approximates to a resistance of the power line 140 of the pixel unit 100.

Figure 5A:
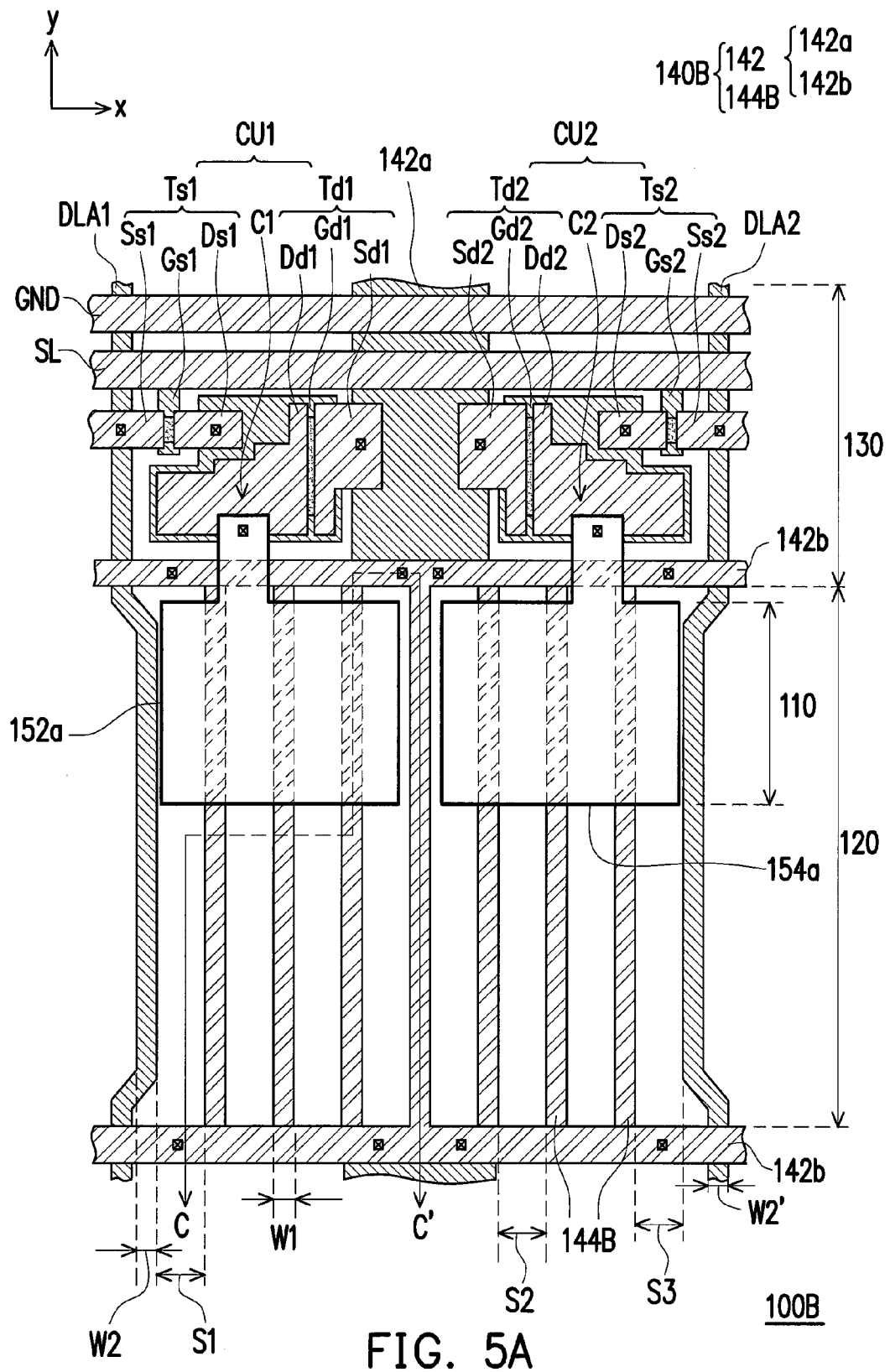
FIG. 5A is a top view of a pixel unit of an organic electroluminescent display according to yet another embodiment of the invention.
Figure 5B:
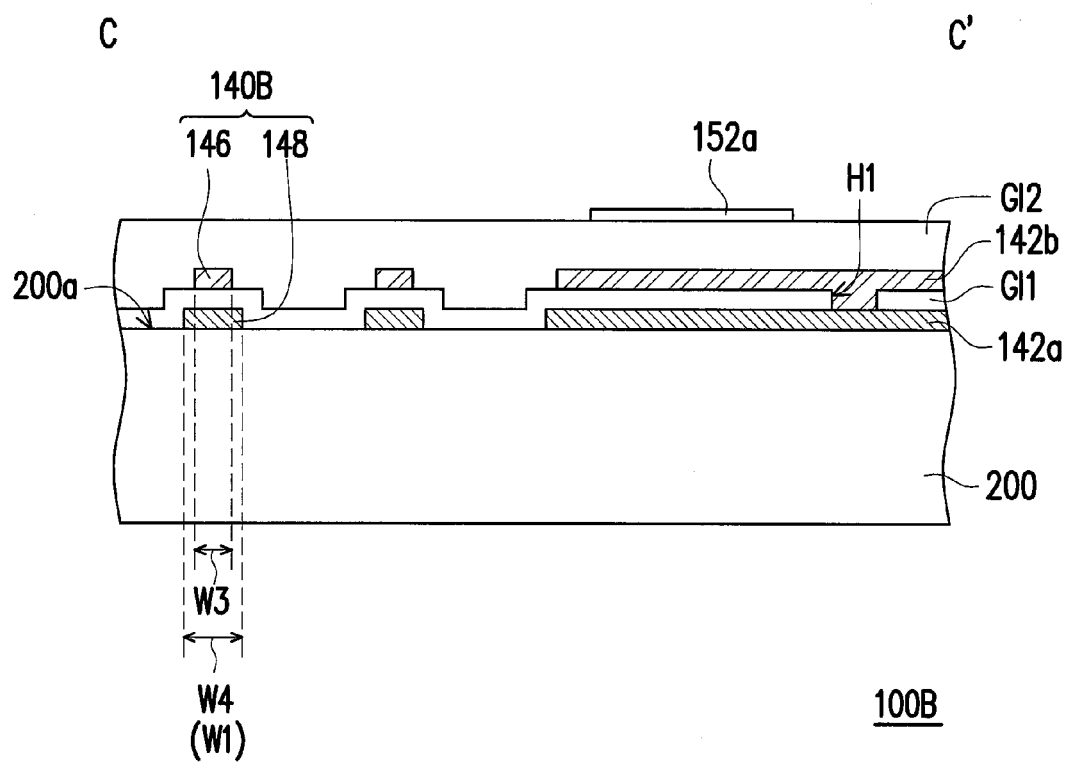
FIG. 5B is a cross-sectional view of the pixel unit of the organic electroluminescent display of FIG. 5A along section-line C-C'.

FIG. 5A is a top view of a pixel unit of an organic electroluminescent display according to yet another embodiment of the invention. FIG. 5B is a cross-sectional view of the pixel unit of the organic electroluminescent display of FIG. 5A along section-line C-C'. A pixel unit 100B of an organic electroluminescent display of FIG. 5A is similar to the pixel unit 100A of the organic electroluminescent display of FIG. 4, thus identical or corresponding elements are indicated by the same or corresponding reference numbers. Differences between the two are: the second space S2 of the pixel unit 100B is different from the second space S2 of the pixel unit 100A; the width W1 of each of branch portions 144B of the pixel unit 100B is different from the width W1 of each of the branch portions 144 of the pixel unit 100A; and an amount of the branch portions 144B of the pixel unit 100B is different from the amount of the branch portions 144 of the pixel unit 100A. In particular, a structure of a power line 140B of the pixel unit 100B is different from a structure of the power line 140 of the pixel unit 100A. The differences between the two are specifically described as follows, whereas the identical parts of the two may refer to related descriptions of FIG. 4 by reference with the reference numbers in FIG. 5A, which will not be repeated hereinafter.

In comparison with the pixel unit 100A, while maintaining the width W1 of each of the branch portions 144B unchanged, the pixel unit 100B may increase the second space S2 between adjacent two of the branch portions 144B and reduce the amount of the branch portions 144B, so as to further improve the light transmittance of the transparent area 120. For instance, the width W1 of each of the branch portions 144B of the pixel unit 100 of FIG. 4A is still maintained at 15 μm, and the second space S2 and the amount of branch portions 140 may be optimized to be 40.75 μm and 7, respectively. Comparison of FIG. 4 and FIG. 5A shows that, the light transmittance of the transparent area 120 in pixel unit 100B of FIG. 5A is obviously higher than the light transmittance of the transparent area 120 in the pixel unit 100A of FIG. 4. It should be noted that, at the time the pixel unit 100B further improves the light transmittance of the transparent area 120, the pixel unit 100B may also make a resistance of the power line 140B approximate to the resistance of the power line 140 of the pixel unit 100A through the power line 140B with special structure under circumstance where the second space S2 is increased and the amount of the branch portions 144B is reduced.

Referring to FIG. 5A and FIG. 5B, the power line 140B of the pixel unit 100B includes an upper conductive structure 146 (marked in FIG. 5B) and a lower conductive structure 148 (marked in FIG. 5B) which are overlapped. The lower conductive structure 148 is disposed between the substrate 200 and the upper conductive structure 146. To be specific, in the present embodiment, the branch portions 144B and the second main portion 142b disposed inside the transparent area 120 both include the upper conductive structure 1146 and the lower conductive structure 148. The upper conductive structure 146 may be filled into a contact window H1 of the insulation layer GI1 (marked in FIG. 5B) to be electrically contacted to the lower conductive structure 148 to include a potential identical to that of the lower conductive structure 148. In the present embodiment, the upper conductive structure 146 may be manufactured by utilizing one of the layers having the gate Gs1 of the active device Ts1 and the source Ss1 of the active device Ts1 (e.g., the same layer of the source Ss1 of the active device Ts1), whereas the lower conductive structure 148 may be manufactured by utilizing another layer different from that of the upper conductive structure 146 (e.g., the same layer of the gate Gs1 of the active device Ts1). However, the invention is not limited thereto. In other embodiments, the upper conductive structure 146 or the lower conductive structure 148 may also be manufactured by selecting a conductive structure other the layers of the gate Gs1 of the active device Ts1 and the source Ss1 of the active device Ts1.

It is worth mentioning that, one of the upper conductive structure 146 and the lower conductive structure 148 of the power line 140B is capable of completely covering another one of the upper conductive structure 146 and the lower conductive structure, Accordingly, in case the power line 140B utilizes a dual-layer structure to maintain the resistance which approximates to that of the power line 140 of FIG. 4, an area of an orthographic projection of the power line 140B on the substrate 200 may be relatively smaller than an area of an orthographic projection of the power line 140 of FIG. 4 on the substrate 200. As a result, an aperture ratio of the transparent area 120 of the pixel unit 100B may be improved, namely, the widths of the first space S1, the second space S2 and/or the third space S3 may be increased. Also, in the present embodiment, a line width W3 (marked in FIG. 5B) of the upper conductive structure 146 being formed later on the direction parallel to the scan line SL may be less than a line width W4 (marked in FIG. 5B) of the lower conductive structure 148 being formed earlier on the direction parallel to the scan line SL. Accordingly, despite a little alignment offset between the upper conductive structure 146 and the lower conductive structure 148, the upper conductive structure 146 cannot easily exceed the lower conductive structure 148 to cause bad influences to the light transmittance of the transparent area 120.

Figure 6A:
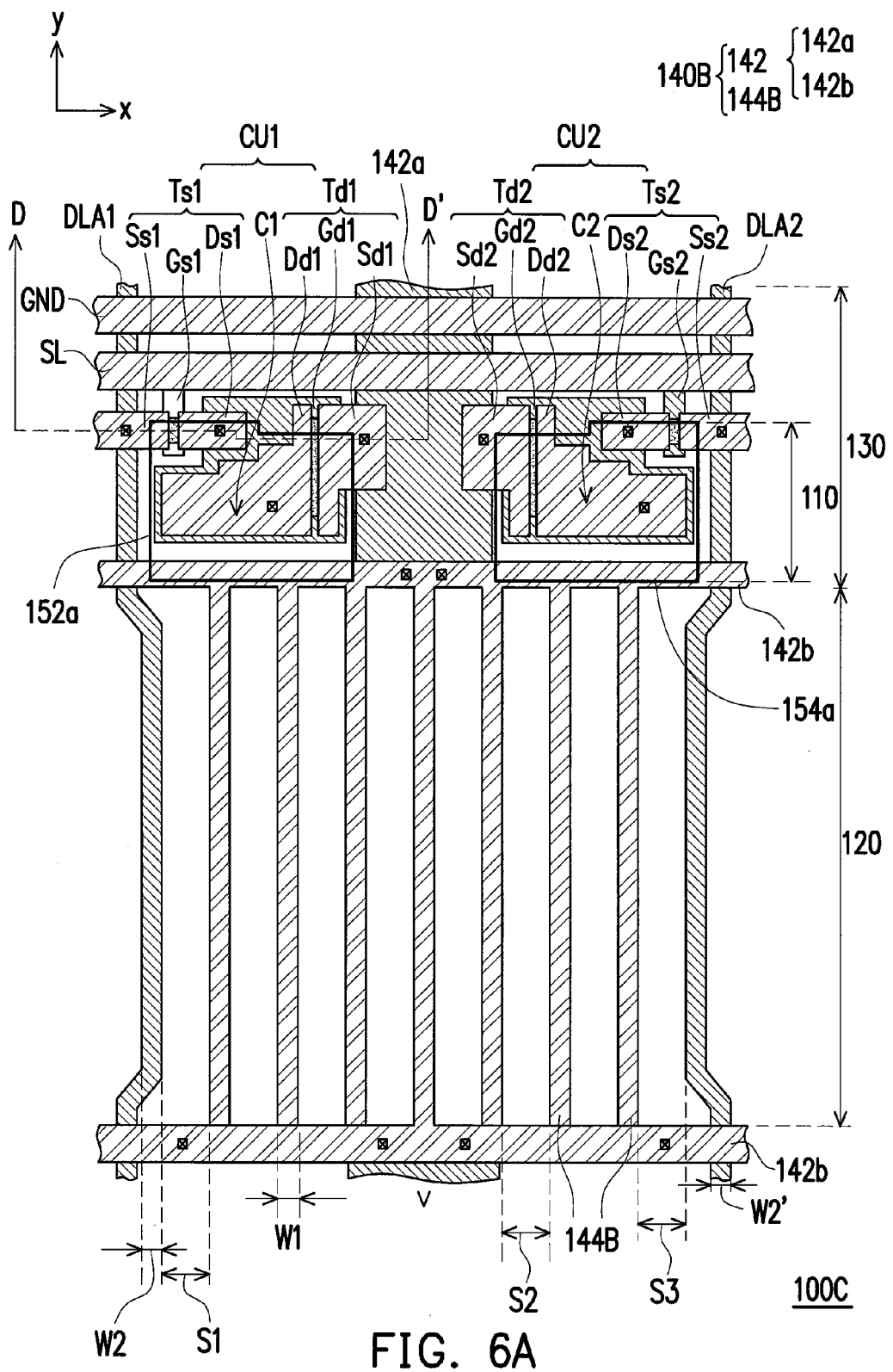
FIG. 6A is a top view of a pixel unit of an organic electroluminescent display according to still another embodiment of the invention.
Figure 6B:
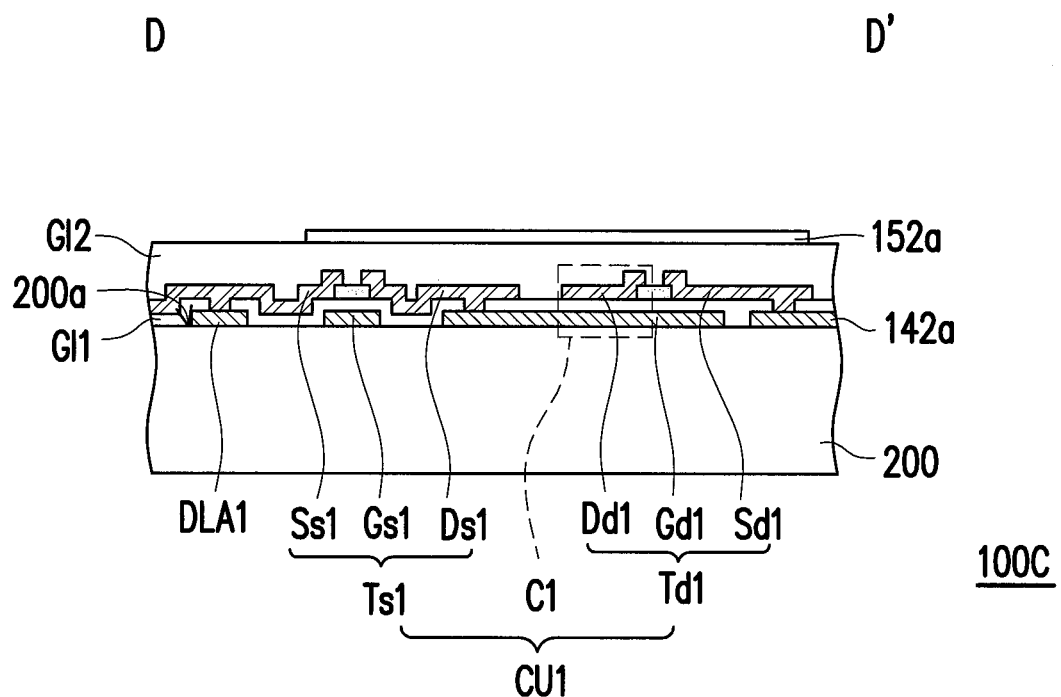
FIG. 6B is a cross-sectional view of the pixel unit of the organic electroluminescent display of FIG. 6A along section-line D-D'.

FIG. 6A is a top view of a pixel unit of an organic electroluminescent display according to still another embodiment of the invention. FIG. 6B is a cross-sectional view of the pixel unit of the organic electroluminescent display of FIG. 6A along section-line D-D'. A pixel unit 100C of an organic electroluminescent display of FIG. 6A is similar to the pixel unit 100B of the organic electroluminescent display of FIG. 5A, thus identical or corresponding elements are indicated by the same or corresponding reference numbers. A difference between the two is: positions for disposing the electrode 152a of the first organic light-emitting diode and the electrode 154a of the second organic light-emitting diode in the pixel unit 100C are different from positions for disposing the electrode 152a of the first organic light-emitting diode and the electrode 154a of the second organic light-emitting diode in the pixel unit 100B. The difference between the two are specifically described as follows, whereas the identical parts of the two may refer to related descriptions of FIG. 5A by reference with the reference numbers in FIG. 6, which will not be repeated hereinafter.

In the pixel unit 100C, the first control element CU1 is disposed inside the first light emitting area so that the first control element CU1 is disposed overlapping with the electrode 152a of the first organic light-emitting diode. The second control element CU2 is disposed inside the second light emitting area so that the second control element CU2 is disposed overlapping with the electrode 154a of the second organic light-emitting diode. In other words, the electrode 152a of the first organic light-emitting diode and the electrode 154a of the second organic light-emitting diode may be disposed inside the control element area 130 instead of inside the transparent area 120. Accordingly, the light transmittance of the transparent area 120 may be significantly improved so that a more preferable effect in watching the background image behind the organic electroluminescent display through the pixel unit 100C may be provided for the user.

Figure 7:
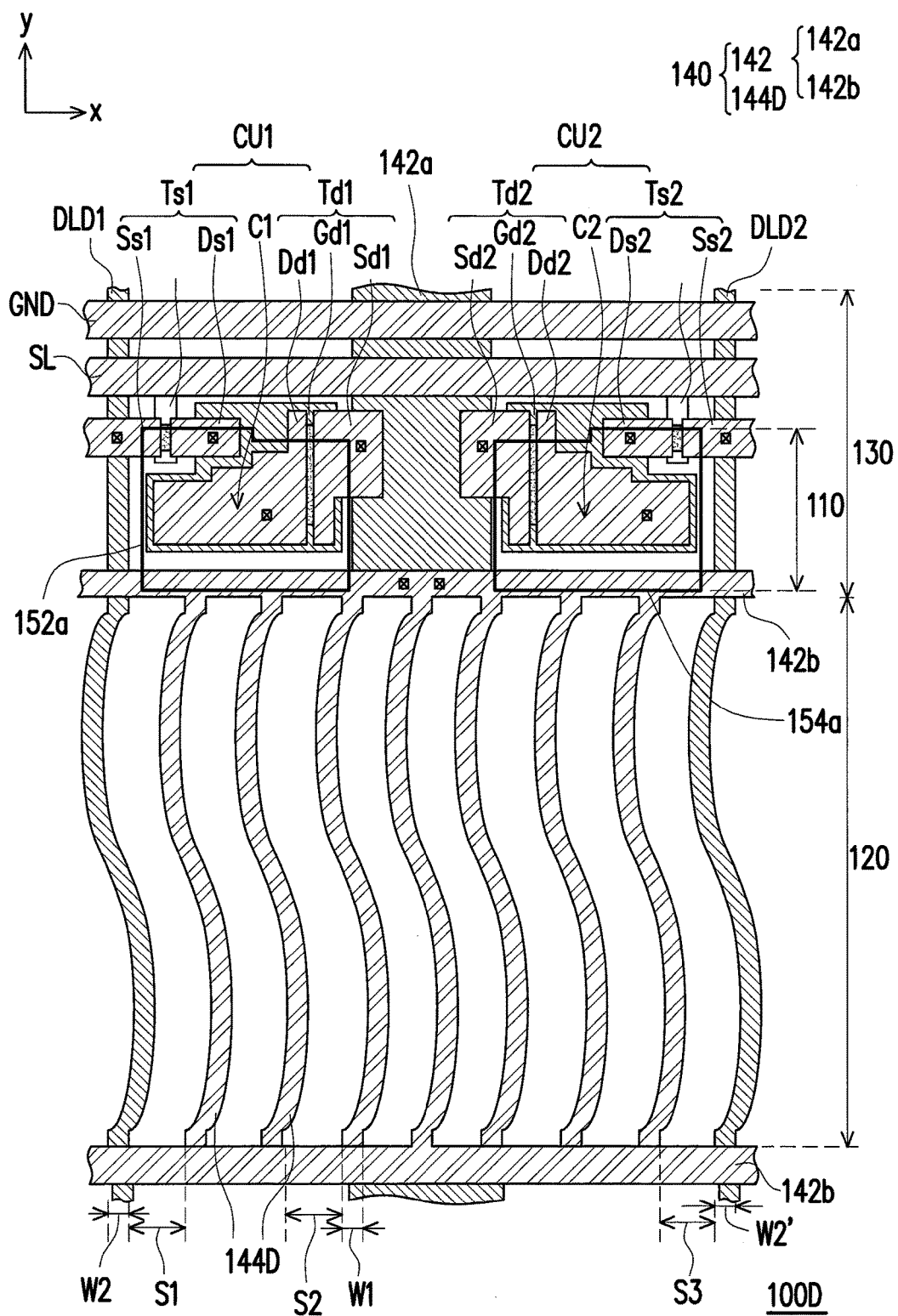
FIG. 7 is a top view of a pixel unit of an organic electroluminescent display according to an embodiment of the invention.

FIG. 7 is a top view of a pixel unit of an organic electroluminescent display according to an embodiment of the invention. A pixel unit 100D of an organic electroluminescent display of FIG. 7 is similar to the pixel unit 100C of the organic electroluminescent display of FIG. 6A, thus identical or corresponding elements are indicated by the same or corresponding reference numbers. Differences between the two are: a configuration of branch portions 144D of the pixel unit 100D is different from a configuration of the branch portions 144B of the pixel unit 100C; and a configuration of first and second data lines DLD1, DLD2 of the pixel unit 100D is different from a configuration of the first and second data lines DLA1, DLA2 of the pixel unit 100C. The differences between the two are specifically described as follows, whereas the identical parts of the two may refer to related descriptions of FIG. 6A by reference with the reference numbers in FIG. 7, which will not be repeated hereinafter.

Referring to FIG. 7, the first and second data lines DLD1, DLD2 of the pixel unit 100D may be curves in a region encircled by the adjacent two of the second main portions 142b rather than zigzags as shown by the first and second data lines DLA1, DLA2 in FIG. 6A. The branch portions 144D of the pixel unit 100D may be curve branch portions. Furthermore, the curve branch portions include two curve line segments having opposite opening directions and connected to each other. In brief, the curve branch portions are in S-shape. The branch portions 144D of the pixel unit 100D may be spaced apart from and in parallel to one another.

However, the invention is not limited thereto. In other embodiments, a part of the branch portions of the power line may also include the branch portions connected to one other, and the branch portions may also be designed to include shapes other than straight line and curve. Hereinafter, examples are described by reference with FIG. 8 and FIG. 9.

Figure 8:
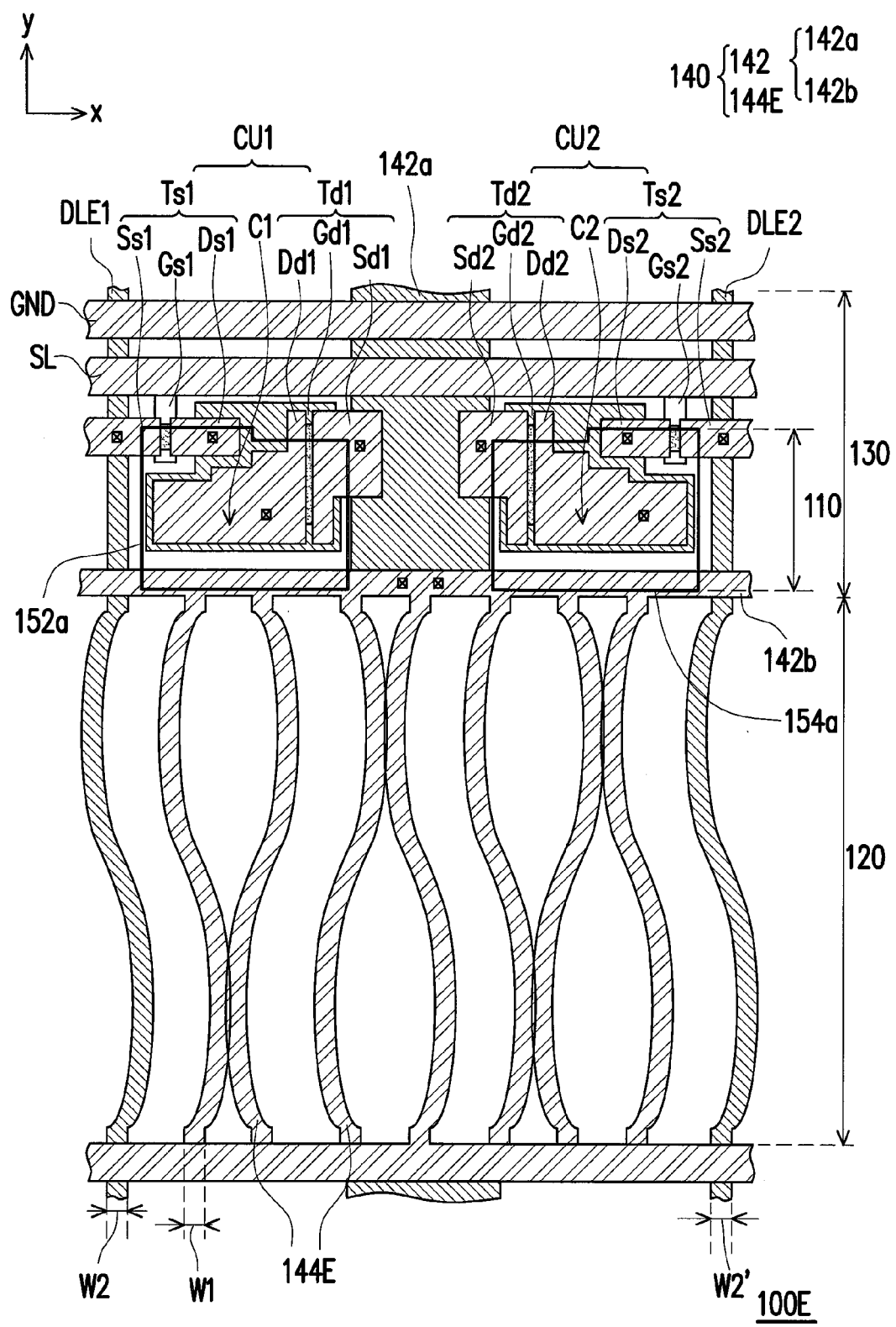
FIG. 8 is a top view of a pixel unit of an organic electroluminescent display according to another embodiment of the invention.

FIG. 8 is a top view of a pixel unit of an organic electroluminescent display according to another embodiment of the invention. A pixel unit 100E of an organic electroluminescent display of FIG. 8 is similar to the pixel unit 100C of the organic electroluminescent display of FIG. 6A, thus identical or corresponding elements are indicated by the same or corresponding reference numbers. Differences between the two are: the configuration of branch portions 144E of the pixel unit 100E is different from the configuration of the branch portions 144D of the pixel unit 100D; and the configuration of first and second data lines DLE1, DLE2 of the pixel unit 100E is different from the configuration of the first and second data lines DLA1, DLA2 of the pixel unit 100C. The differences between the two are specifically described as follows, whereas the identical parts of the two may refer to related descriptions of FIG. 6A by reference with the reference numbers in FIG. 8, which will not be repeated hereinafter.

Referring to FIG. 8, the first and second data lines DLE1, DLE2 of the pixel unit 100E may be curves in a region encircled by the adjacent two of the second main portions 142b rather than zigzags as shown by the first and second data lines DLA1, DLA2 in FIG. 6A. The branch portions 144E of the pixel unit 100E may also be curves. A difference between the branch portions 144E of FIG. 8 and the branch portions 144D of FIG. 7 is that, a part of the branch portion 144E of FIG. 8 are not disposed in parallel. The part of the branch portions 144E of the pixel unit 100E may also be selectively connected to one another. To be specific, the branch portions 144E may be arranged along the direction x, wherein the first, fourth, fifth and seventh branch portions may be disposed in parallel; the second, third and sixth branch portions may be disposed in parallel; and the first, fourth, fifth and seventh branch portions may not be disposed in parallel to the second, third and sixth branch portions. More specifically, the first and second branch portions are intersected; the third and fourth branch portions are intersected; the fifth and sixth branch portions are intersected; and the sixth and seventh branch portions are intersected.

Figure 9:
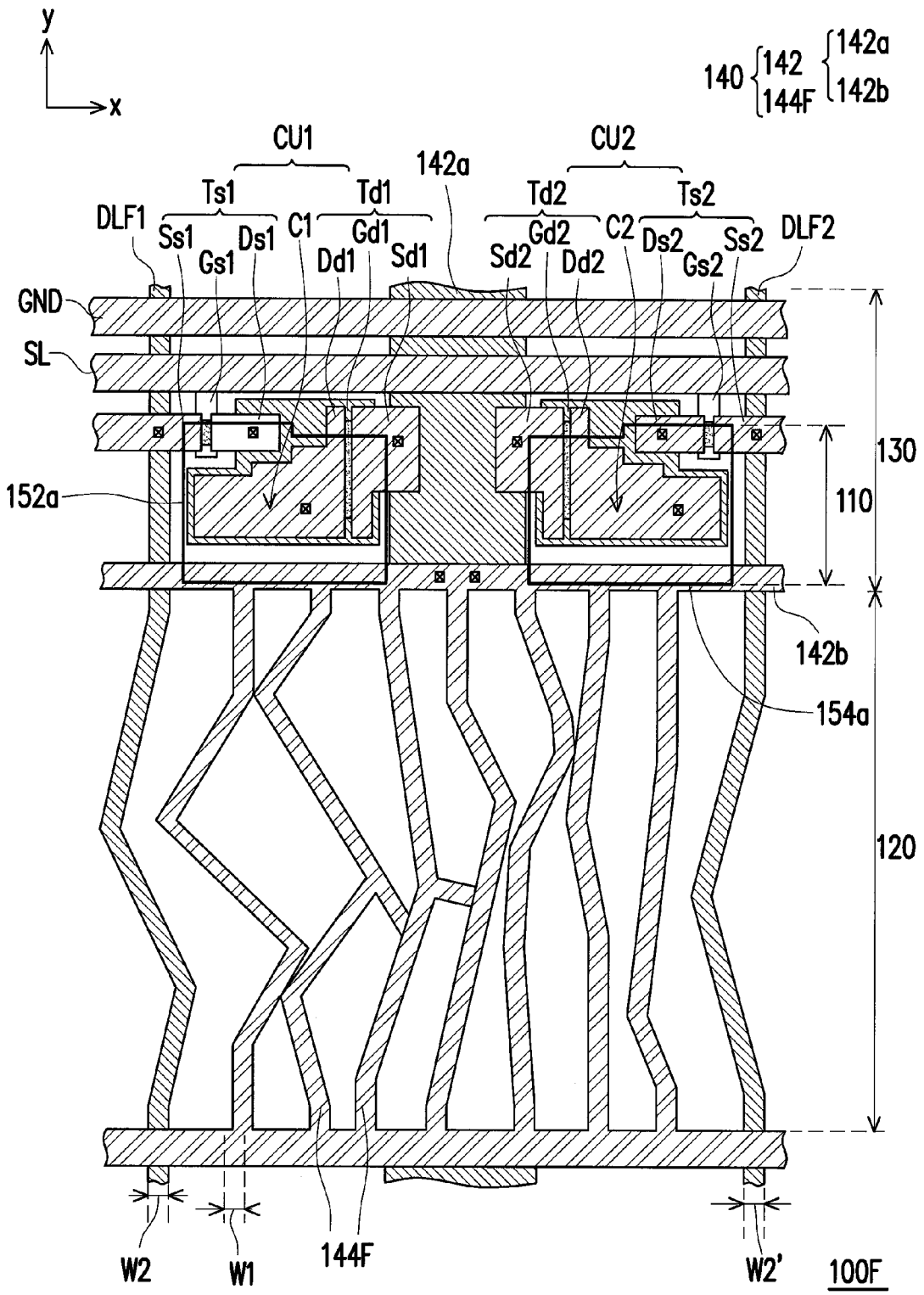
FIG. 9 is a top view of a pixel unit of an organic electroluminescent display according to yet another embodiment of the invention.

FIG. 9 is a top view of a pixel unit of an organic electroluminescent display according to yet another embodiment of the invention. A pixel unit 100F of an organic electroluminescent display of FIG. 9 is similar to the pixel unit 100C of the organic electroluminescent display of FIG. 6A, thus identical or corresponding elements are indicated by the same or corresponding reference numbers. A difference between the two is: a configuration of branch portions 144F of the pixel unit 100F is different from the configuration of the branch portions 144B of the pixel unit 100C. The difference between the two is specifically described as follows, whereas the identical parts of the two may refer to related descriptions of FIG. 6A by reference with the reference numbers in FIG. 9, which will not be repeated hereinafter.

First and second data lines DLF1, DLF2 of the pixel unit 100F are in zigzags inside a region encircled by the adjacent two of the main portions 142b. The branch portions 144F of the pixel unit 100F may be zigzag branch portions. Each of the zigzag branch portions 144F may be formed by serially connecting a plurality of straight line segments with the respective extending direction intersected, and the zigzag branch portions 144F may not be disposed in parallel to one another. It is worth mentioning that, the branch portions 144E, 144F of FIG. 8, FIG. 9 are irregularly distributed. In other words, periodic arrangement cannot be easily found on the branch portions 144E, 144F of FIG. 8, FIG. 9 in multiple directions. Accordingly, the branch portions 144E, 144F of the pixel units 100E, 100F cannot easily be interfered with the background object having the periodic structure, thereby reducing a possibility for generating the Moire fringes in the conventional art.

In summary, in the pixel unit of the organic electroluminescent display according to an embodiment of the invention, the branch portions of the power line are distributed inside the transparent area for each of pixel units. Therefore, in case the pixel units are arranged in a plurality of rows to compose an organic electroluminescent display, the branch portions of the power line and the data line are distributively disposed in a region between adjacent two of the rows of the control elements. Accordingly, differences between the light transmittances in positions of the region between the adjacent two control elements cannot be overly big, so as to improve the blur issue for the background image due to the data lines and the power being overly concentrated at specific positions.

In addition, in the pixel unit of the organic electroluminescent display according to an embodiment of the invention, each of the branch portions of the power line may be designed in irregular shapes, or the branch portions of the power line may be irregularly disposed. Accordingly, the branch portions of the pixel unit cannot easily be interfered with the background object having the periodic structure, so as solve the problem of the Moire fringes in the conventional art.

It will be apparent to those skilled in the art that various modifications and variations can be made to the structure of the disclosed embodiments without departing from the scope or spirit of the disclosure. In view of the foregoing, it is intended that the disclosure cover modifications and variations of this specification provided they fall within the scope of the following claims and their equivalents.

What is claimed is:

1. A pixel unit of an organic electroluminescent display, the pixel unit having a light emitting area and a transparent area, and the pixel unit comprising:
   a scan line and a data line;
   a control element, electrically connected to the scan line and the data line;
   a power line, electrically connected to the control element, wherein the power line comprises:
      a main portion; and
      a plurality of branch portions, connected to the main portion, and disposed inside the transparent area, wherein the branch portions are electrically independent from the data line, a width of each of the branch portions is identical to a minimum line width of the data line, the branch portions are straight line branch portions, curve branch portions or zigzag branch portions, and the branch portions are irregularly distributed; and
   an organic light-emitting diode, disposed inside the light emitting area, and electrically connected to the power line and the control element.

2. The pixel unit of the organic electroluminescent display of claim 1, wherein the main portion comprises:
   a first main portion, parallel to the data line;
   at least one second main portion, connected to the first main portion, and parallel to the scan line.

3. The pixel unit of the organic electroluminescent display of claim 1, wherein the control element is disposed inside the light emitting area so that the control element is disposed overlapping with the organic light-emitting diode.

4. The pixel unit of the organic electroluminescent display of claim 1, wherein the power line comprises an upper conductive structure and a lower conductive structure, and a line width of the upper conductive structure is less than a line width of the lower conductive structure.

5. The pixel unit of the organic electroluminescent display of claim 1, wherein parts of the branch portions of the power line connected to one another.

6. The pixel unit of the organic electroluminescent display of claim 1, wherein the control element comprises at least two active elements and at least one capacitor.

7. A pixel unit of an organic electroluminescent display, the pixel unit having a first light emitting area, a second light emitting area and a transparent area, and the pixel unit comprising:
   a scan line, a first data line and a second data line;
   a first control element, electrically connected to the scan line and the first data line;
   a second control element, electrically connected to the scan line and the second data line;
   a power line, electrically connected to the first control element and the second the control element, wherein the power line comprises:
      a main portion; and
      a plurality of branch portions, connected to the main portion, disposed inside the transparent area, and distributed between the first data line and the second data line, wherein the branch portions are electrically independent from the first data line and the second data line, a width of each of the branch portions is identical to minimum line widths of the first data line and the second data line, the branch portions are straight line branch portions, curve branch portions or zigzag branch portions, and the branch portions are irregularly distributed;
   a first organic light-emitting diode, disposed inside the first light emitting area, and electrically connected to the power line and the first control element; and
   a second organic light-emitting diode, disposed inside the second light emitting area, and electrically connected to the power line and the second control element.

8. The pixel unit of the organic electroluminescent display of claim 7, wherein the main portion comprises:
   a first main portion, disposed between the first data line and the second data line, and parallel to the first data line and the second data line; and
   at least one second main portion, connected to the first main portion, and parallel to the scan line.

9. The pixel unit of the organic electroluminescent display of claim 7, wherein the first control element is disposed inside the first light emitting area so that the first control element is disposed overlapping with the first organic light-emitting diode, and the second control element is disposed inside the second light emitting area so that the second control element is disposed overlapping with the second organic light-emitting diode.

10. The pixel unit of the organic electroluminescent display of claim 7, wherein the power line comprises an upper conductive structure and a lower conductive structure, and a line width of the upper conductive structure is less than a line width of the lower conductive structure.

11. The pixel unit of the organic electroluminescent display of claim 7, wherein parts of the branch portions of the power line connected to one another.

12. The pixel unit of the organic electroluminescent display of claim 7, wherein the first control element and the second control element each comprises at least two active elements and at least one capacitor.

13. A pixel unit of an organic electroluminescent display, the pixel unit having a light emitting area and a transparent area, and the pixel unit comprising:
   a scan line and a data line;
   a control element, electrically connected to the scan line and the data line;
   a power line, electrically connected to the control element, wherein the power line comprises:
   a main portion, wherein the main portion comprises a first main portion parallel to the data line, and at least one second main portion connected to the first main portion and parallel to the scan line; and
   a plurality of branch portions, connected to the main portion, and disposed inside the transparent area, wherein the branch portions are electrically independent from the data line, and a width of each of the branch portions is identical to a minimum line width of the data line; and
   an organic light-emitting diode, disposed inside the light emitting area, and electrically connected to the power line and the control element.

14. The pixel unit of the organic electroluminescent display of claim 13, wherein a first space is provided between the data line and one of the branch portions that is closest to the data line, and a second space is provided between adjacent two of the branch portions, and the first space and the second space are identical.

* * * * *